(12) United States Patent
Hallquist et al.

(10) Patent No.: US 8,467,997 B2
(45) Date of Patent: Jun. 18, 2013

(54) NUMERICALLY-SIMULATED RIGID BODY CREATION MEHTODS AND SYSTEMS THEREOF

(75) Inventors: John O. Hallquist, Livermore, CA (US); Brian Wainscott, San Ramon, CA (US)

(73) Assignee: Livermore Software Technology Corporation, Livermore, CA (US)

( * ) Notice: Subject to any disclaimer, the term of this patent is extended or adjusted under 35 U.S.C. 154(b) by 0 days.

(21) Appl. No.: 13/460,062

(22) Filed: Apr. 30, 2012

(65) Prior Publication Data
US 2012/0215498 A1  Aug. 23, 2012

Related U.S. Application Data

(63) Continuation-in-part of application No. 12/641,276, filed on Dec. 17, 2009, now Pat. No. 8,200,458.

(60) Provisional application No. 61/253,161, filed on Oct. 20, 2009.

(51) Int. Cl.
*G06F 17/50* (2006.01)
(52) U.S. Cl.
USPC .......................................................... 703/1
(58) Field of Classification Search
USPC .......................................................... 703/1
See application file for complete search history.

(56) References Cited

PUBLICATIONS

Lin: DYNA3D: A Nonlinear, Explicit, Three-Dimensional Finite Element Code for Solid and Structural Mechanics User Manual: pp. 1-618; UCRL-MA-107254, Jan. 2005.*
EPO Extended Search Report for Application Ser. No. 10186506.1-2224, Jan. 12, 2011.
EPO Notice of Publication for Application Ser. No. 10186506.1-2224, Apr. 20, 2011.
EPO Office Action for Application Ser. No. 10186506.1, May 17, 2011.
Office Action for U.S. Appl. No. 12/641,276, Jan. 13, 2012.
Reply to the Jan. 13, 2012 Office Action for U.S. Appl. No. 12/641,276 Apr. 11, 2012.
Notice of Allowance/Search Results for U.S. Appl. No. 12/641,276 Apr. 25, 2012.

* cited by examiner

*Primary Examiner* — Hugh Jones
(74) *Attorney, Agent, or Firm* — Roger H. Chu

(57) ABSTRACT

Methods and systems for creating numerically-simulated rigid bodies in finite element analysis are disclosed. At least one rigid finite element in a finite element model is designated for forming one or more numerically-simulated rigid bodies (RBs). Each numerically-simulated RB comprises an arbitrary number of rigid finite elements connecting to one another in an arbitrary shape. Each numerically-simulated RB is created by locating all of the elements embedded in the FEA model through shared node or nodes. A procedure of using element definition as a guide to set up an array of node flags, each node flag for one node such that all numerically-simulated RBs defined in the model can be located efficiently. Once all numerically-simulated RBs have been located, each unique numerically-simulated RB is defined as a unique linked-list of connected rigid finite elements.

13 Claims, 16 Drawing Sheets

701

702

703

704

705

706

707

NUMERICALLY-SIMULATED RIGID BODY CREATION MEHTODS AND SYSTEMS THEREOF

CROSS REFERENCE TO RELATED APPLICATIONS

This application is a continuation-in-part of a co-pending U.S. patent application Ser. No. 12/641,276 filed on Dec. 17, 2009 for "CREATION OF SIMULATED RIGID BODIES IN A FINITE ELEMENT ANALYSIS", which claims priority from a U.S. Provisional Patent Application Ser. No. 61/253,161 filed Oct. 20, 2009 for "CREATION OF SIMULATED RIGID BODIES IN A FINITE ELEMENT ANALYSIS". The entire contents of which are incorporated herein by reference.

FIELD OF THE INVENTION

The present invention generally relates to computer aided engineering analysis, more particularly to systems and methods of creating one or more numerically-simulated rigid bodies (RBs) in a finite element analysis (FEA) model used for simulating behaviors of a product in a computer system.

BACKGROUND OF THE INVENTION

Computer aided engineering (CAE) has been used for supporting engineers in many tasks. For example, in a structure or engineering product design procedure, CAE analysis, particularly finite element analysis, has often been employed to evaluate simulated responses (e.g., stresses, displacements, etc.) under various simulated loading conditions (e.g., static or dynamic).

FEA is a computerized method widely used in industry to simulate (i.e., model and solve) engineering problems relating to complex products or systems (e.g., cars, airplanes, consumer products, etc.) such as three-dimensional non-linear structural design and analysis. FEA derives its name from the manner in which the geometry of the object under consideration is specified. The geometry is defined by elements and nodal points. There are a number of types of finite elements: solid elements for volumes or continua, shell or plate elements for surfaces and beam or truss elements for one-dimensional structure objects. The geometry of each finite element is defined by nodal points, for example, a brick or hexahedral element comprising eight corner nodes.

Generally these finite elements are deformable under loading. However, in certain application, rigid finite elements or rigid elements are required. Rigid elements are not deformed under any loading condition. Rigid elements can be used for modeling certain rigid structural components, for example, bolts, discrete particles or rigid bodies. To represent a rigid body in a finite element analysis model, prior art approaches require each and every rigid body to be defined with a unique identifier. For example, if there are two different rigid bodies defined in a finite element analysis model, two different identifiers must be provided, so that rigid elements that belong to either of the two unique identifiers, can be grouped together properly. For each rigid body, the inertial properties are computed from the geometry of the rigid elements included within the rigid body. While the prior art approach is straightforward for a relatively small number of rigid bodies, it is not feasible when a finite element analysis model contains a large number of rigid bodies (e.g., tens of thousands to millions). It would require a tremendous amount of man hours (i.e., costs) to define the large number of RBs hence not feasible in a production environment.

Many of today's engineering simulations require such capability (i.e., having millions of RBs), for example, simulating millions of rigid granular particles filling into a container (e.g., a drug manufacturer in pharmaceutical manufacturing). It would, therefore, be desirable to have methods and systems for defining and creating a large number of rigid bodies efficiently without the complexity and tediousness of providing a unique identifier for each and every rigid body. Each rigid body can contain any number of rigid finite elements in arbitrary orientation.

BRIEF SUMMARY OF THE INVENTION

This section is for the purpose of summarizing some aspects of the present invention and to briefly introduce some preferred embodiments. Simplifications or omissions in this section as well as in the abstract and the title herein may be made to avoid obscuring the purpose of the section. Such simplifications or omissions are not intended to limit the scope of the present invention.

Methods and systems for defining and creating numerically-simulated rigid bodies (RBs) in a finite element analysis without explicitly defining any individual identifier for RBs are disclosed. According to one aspect of the present invention, one or more rigid elements or rigid finite elements are defined in a finite element analysis model. For example, the rigid elements may be defined as having a specially-designated material with one command or definition. A rigid element is configured to be a portion for forming one or more numerically-simulated RBs. Each numerically-simulated RB comprises any number of rigid elements that are connected to one another in an arbitrary orientation. No individual identifier for RBs is required in the input description or definition.

According to another aspect of the invention, each RB is represented with a unique linked-list of rigid elements. To locate RBs embedded within a finite element model or finite element analysis model, a scheme or procedure of creating all linked-lists (i.e., RBs) is described below. The procedure loops through all of the rigid elements only once. For each of the rigid elements, there are three possible situations:

(1) None of its neighbors are yet part of a linked-list;
(2) All of its neighbors that are part of a linked-list are all part of the same linked-list; and
(3) Its neighbors come from different linked-list.

According to an exemplary embodiment, a FEA model contains a group of at least rigid finite element is defined. A plurality of node flags is created one for each node in the FEA model. The node flags are initialized with an initialized value that is invalid for identifying numerically-simulated RBs. The RB creation scheme is configured for looping over all of the rigid finite elements in the FEA model once by examining corresponding node flags of a currently-processed rigid element.

When the corresponding node flags contain only the initialized value, the currently-processed element is added to a new linked-list representing a numerically-simulated RB. The new linked-list is identified with a unique label (e.g., the currently-processed element number), and all of the corresponding node flags of the currently-processed element are updated with the unique label.

When the corresponding node flags contain either the initialized value or a particular linked-list's label, the currently-processed element is added to the particular linked-list, and all of the corresponding node flags are updated with the particular list's label.

When the corresponding node flags contain more than one linked-lists' label, more than one linked-lists are merged into one unique list (e.g., the list having a smallest value label), and all of the corresponding node flags are updated with the merged list's label.

After all of the linked-lists representing RBs have been identified and created, physical properties of each RB are calculated from corresponding rigid elements contained therein. Finite element analysis of an engineering product (e.g., car, airplane, particles, consumer products, etc.) can then be carried out in a normal manner including all RBs. In one exemplary usage, a large number of granular particles are modeled as RBs with one RB per granular particle. Interactions (e.g., contacts, collisions, etc.) amongst RBs can be calculated or simulated using the finite element analysis.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

DETAILED DESCRIPTION

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, and components have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the present invention are discussed herein with reference to FIGS. 1A-7. However, those skilled in the art will readily appreciate that the detailed description given herein with respect to these figures is for explanatory purposes as the invention extends beyond these limited embodiments.

Figure 1A:
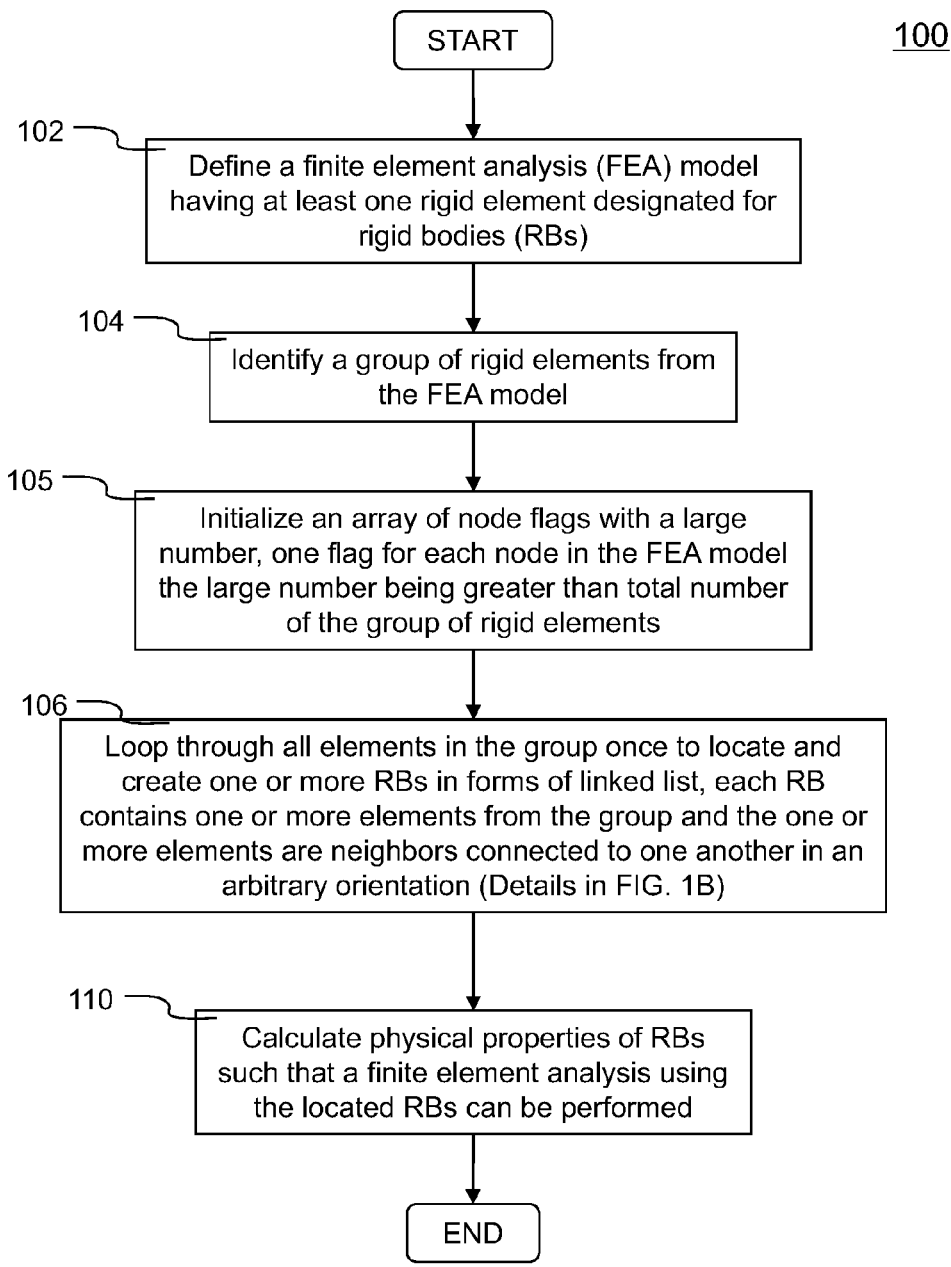
FIG. 1A and FIG. 1B collectively are a flowchart illustrating an exemplary process of creating numerically-simulated rigid bodies in a finite element analysis, according to an embodiment of present invention.
Figure 1B:
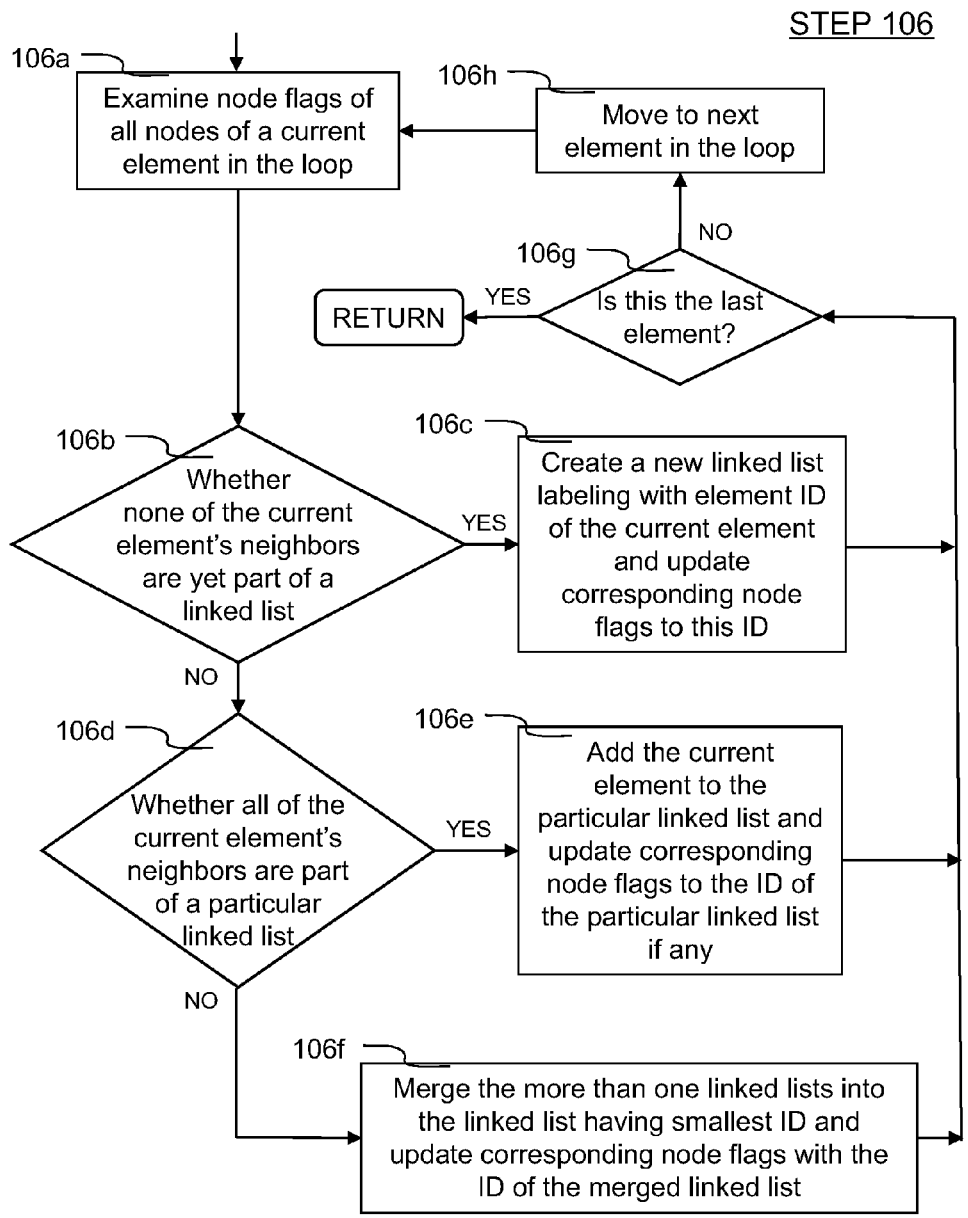

Referring first to FIGS. 1A and 1B, it is shown a flowchart illustrating an exemplary process 100 of creating numerically-simulated rigid bodies in a finite element analysis for assisting user to make design decision in improvement of an engineering product (e.g., car, airplane), according to an embodiment of the present invention. Process 100 is preferably implemented in software.

Process 100 starts, at step 102, by defining a finite element analysis (FEA) model that models an engineering product to be designed or improved. The FEA model includes a number of nodal points and a number of elements including at least one rigid finite element for forming numerically-simulated rigid body. In one embodiment, a group of rigid elements in step 104 is created by user as a solid element having a specially-designated material (e.g., rigid material), which indicates that these rigid elements are configured for forming rigid bodies. There is no requirement for explicitly defining each individual rigid body (RB). All RBs are embedded in the FEA model. Each RB is defined as a group of neighbors connecting to one another in an arbitrary orientation. Process 100 is configured to locate each of the defined rigid bodies via element node-definition or connectivity information of the rigid elements, and then to create a numerical representation (i.e., a unique linked-list for each RB). In addition, other material properties (i.e., physical quantities) can also be specified by the user for each rigid material type, for example, mass density.

Figure 2:
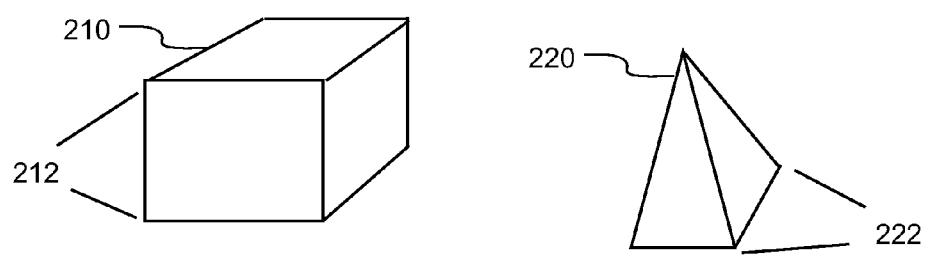
FIG. 2 is a diagram showing exemplary solid elements of a finite element analysis model.

Any RB can be formed by different combination/orientation of rigid elements. For example, two such rigid solid elements, hexahedral 210 and tetrahedral elements 220 are shown in FIG. 2. The hexahedral element 210 is defined by eight corner nodes 212 (one not shown), while the tetrahedral element 220 defined by four corner nodes 222 (one not shown). In general, the node-definition is referred to respective corner nodes for each element. All nodes that define the geometry of solid elements are initially defined in the FEA model.

Figure 3:
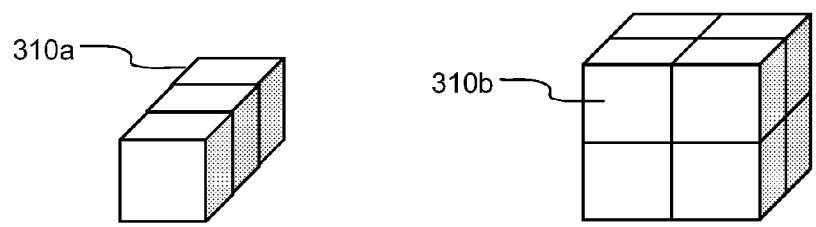
FIG. 3 is a diagram showing exemplary numerically-simulated rigid bodies, according to an embodiment of the present invention.
Figure 3:
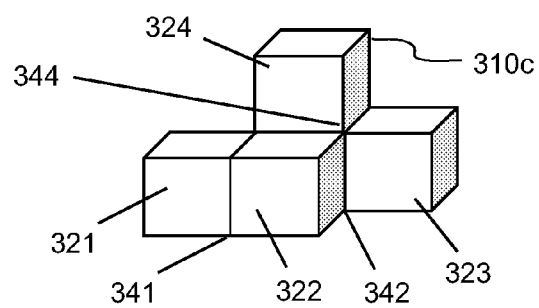

FIG. 3 is a diagram showing three different numerically-simulated RBs 310a-c in accordance with one embodiment of the present invention. The RBs 310a-c are configured with an arbitrary number of rigid elements that are arranged in arbitrary shape (i.e., solid elements connected together in various arbitrary orientations). For example, elements 321-324 are connected to one another to form rigid body 310c via common shared nodes: node 341 is shared between elements 321 and 322; node 342 is shared between elements 322 and 323; and node 344 is shared among three elements 322, 323 and 324.

Referring back to FIG. 1, after step 104, process 100 creates an array of node flags with each flag corresponding to a node in the FEA model at step 105. The array of node flags is then initialized to a large number greater than total number of elements in the group of the rigid elements.

Next at step 106, process 100 locates all rigid elements and creates all of the rigid bodies in forms of linked-lists. In other words, each linked-list represents a particular RB, which is formed with a set of unique rigid elements. Any particular rigid element can only be configured to be a portion of one rigid body. Due to arbitrary shape of the rigid bodies, each linked-list can include an arbitrary number of rigid elements. As long as the rigid elements are connected to one another, those elements belong to a particular rigid body. For example, first and second elements may share a first node, while first and third elements share a second node. And the first and second node may or may not be the same.

According to one embodiment, the above described function is accomplished by step 106 shown in FIG. 1B. Step 106 loops through all of the rigid elements only once to create one or more numerical representation (i.e., linked-list) of the RBs using element-node connectivity information (e.g., corner nodes). During the looping operation, at each currently-processed element (currently-processed element identifiable by a currently-processed element ID), node flags of all nodes of the currently-processed element are examined at 106a. There are three possible situations:

(1) None of its neighbors are yet part of a linked-list;
(2) All of its neighbors that are part of a linked-list are all part of the same linked-list (i.e., one particular linked-list); and
(3) Its neighbors come from different linked-lists (i.e., more than one linked-lists).

At decision 106b, it is determined whether none of the currently-processed element's neighbors are yet part of a linked-list. If "Yes", process 100 creates a new linked-list (representing a RB) and labels the new linked-list with the element ID (e.g., element number) of the currently-processed element at step 106c. Additionally process 100 updates all corresponding node flags to the currently-processed element ID. In other words, the node flags of those nodes of the currently-processed element are changed to the currently-processed element ID at step 106c. Next, process 100 moves to decision 106g thereafter. It is noted the element number is based on a sequential numbering scheme generally used within FEA software (e.g., internal element number).

Referring back to decision 106b, if "No", process 100 moves to another decision 106d. It is determined whether all of the currently-processed element's neighbors are part of a particular linked-list. If "yes", process 100 moves to step 106e to add the currently-processed element to the particular linked-list and update corresponding node flags to the ID of the particular linked-list if any. Process 100 moves to decision 106g thereafter.

Otherwise if "No" at decision 106d, process 100 moves to step 106f. This is the situation (3) stated above (i.e., currently-processed element's neighbors belong to more than one linked-lists). At step 106f, process 100 merges all of the more than one linked-lists into the linked-list having smallest ID (i.e., lowest linked-list ID number) and updates corresponding node flags accordingly with the ID of the merged linked-list. Again, process 100 moves to decision 106g, in which it is determined whether the currently-processed element is the last in the loop. If "No", process 100 moves to next element in the loop and goes back to step 106a to process next element in the loop. Otherwise step 106 ends and process 100 returns.

Finally at step 110, process 100 calculates physical properties of each formed rigid body based on respective elements in each corresponding linked-list (e.g., total mass, initial momentum and energy of the rigid body). Then the finite element analysis can be performed for these numerically-simulated rigid bodies properly. Process 100 ends thereafter.

Figure 5A:
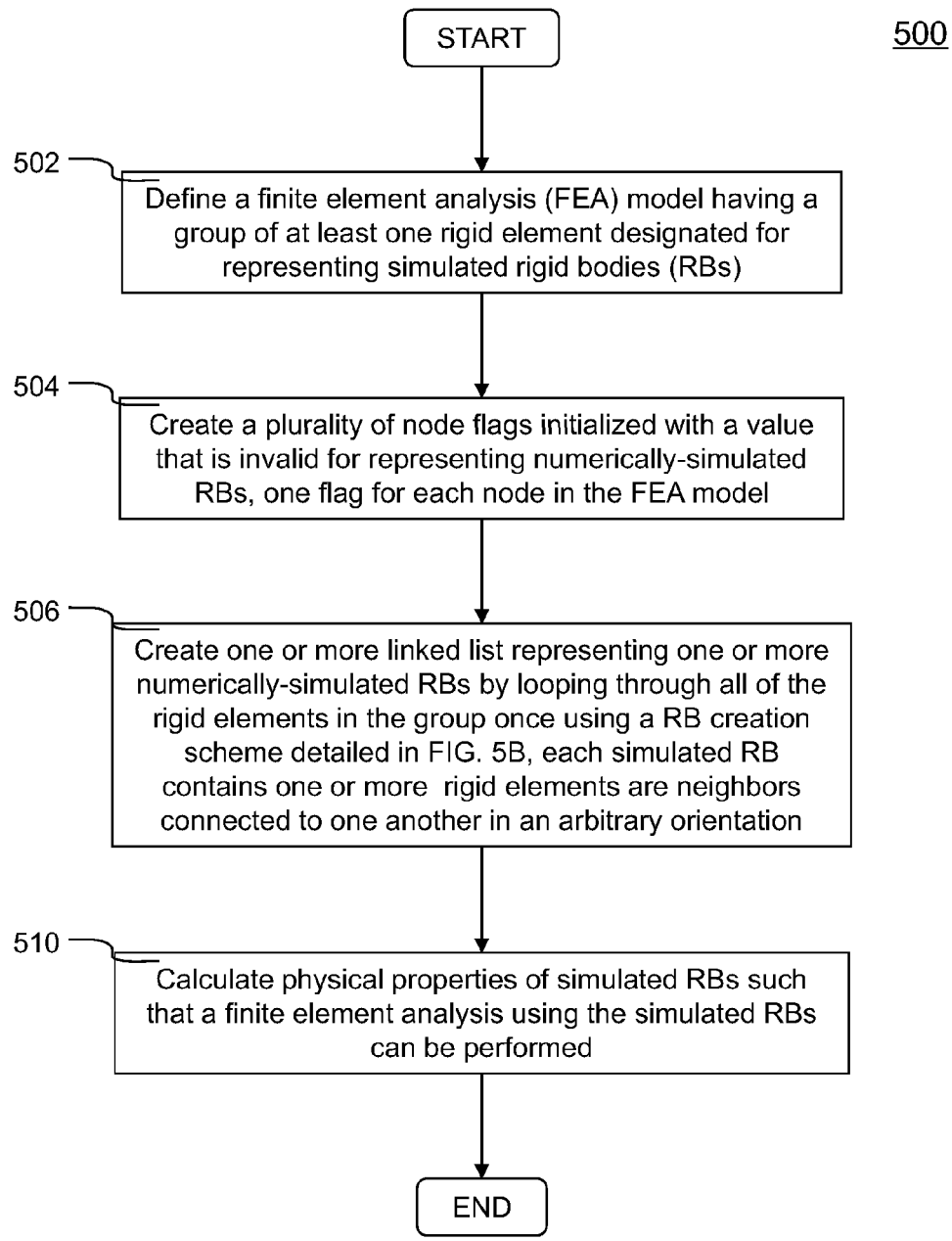
FIGS. 5A and 5B are collectively shown as a flowchart illustrating an exemplary process of creating numerically-simulated RBs in a finite element analysis model used for simulating behaviors of a product, according to an embodiment of the present invention.
Figure 5B:
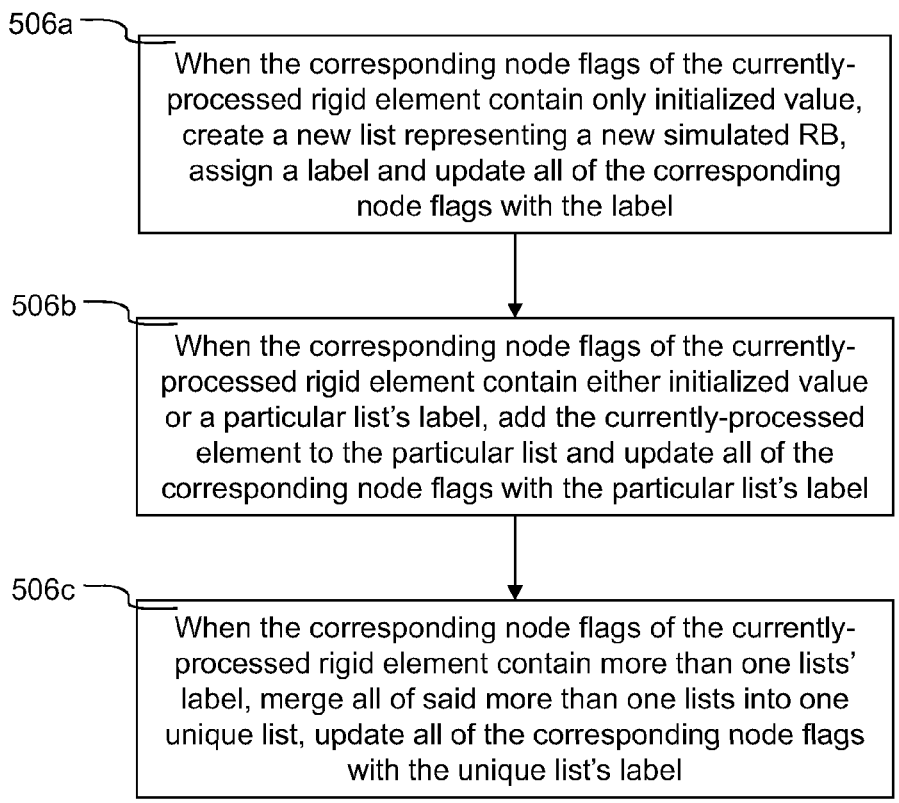

Referring now to FIGS. 5A-5B, there are collective shown a flowchart illustrating an exemplary process 500 of creating one or more numerically-simulated rigid bodies in a finite element analysis model used for simulating behaviors of a product in a computer system, according to an embodiment of the present invention. Process 500 is implemented in software and preferably understood with figures especially with FIGS. 6A-6I and 7.

Process 500 starts by receiving a definition of a finite element analysis model containing a group of at least one rigid finite element in a computer system at step 502. The rigid finite elements are designated for representing numerically-simulated rigid bodies (RBs). One exemplary method for designating these rigid elements is via a user defined command such as a single material type. In other words, one command can be used for designating all rigid elements.

At step 504, a plurality of node flags, one flag for each node in the FEA model, are created and initialized with an initialized value that is invalid for identifying any of numerically-simulated RBs. In one example, the initialized value can be a number outside the possible label range of numerically-simulated RBs (e.g., larger than largest element number, or smaller than the smallest element number of the FEA model). In another example, the initialized value can be a invalid number (e.g., NaN (not a number)) in certain computer systems). In yet another example, the initialized value can be a label while identifiers for numerically-simulated RBs are integer or whole numbers.

Next, at step 506, process 500 creates one or more linked-lists representing respective numerically-simulated RBs by looping through all of the rigid elements in the FEA model only once to examine corresponding node flags of the currently-processed element with a scheme or procedure described in FIG. 5B. Each numerically-simulated RB contains at least one rigid element. Rigid elements in the same linked-list share at least one common node. Numerically-simulated RBs contain any number of rigid elements connected to one another in an arbitrary orientation.

At step 506a, when the corresponding node flags of the currently-processed element contain only initialized value, the currently-processed element is added to a new linked-list. The new linked-list is identified by a unique label (e.g., element number or identifier of the currently-processed element). All corresponding node flags are updated with the unique label.

At step 506b, when the corresponding node flags of the currently-processed element contain either initialized value or a particular linked-list's label, the currently-processed element is added to the particular linked-list and all corresponding node flags are updated with the particular linked-list's label.

At step 506c, when the corresponding node flags of the currently-processed element contain more than one linked-lists' label, process 500 merges more than one linked-lists into one linked-list (e.g., the one having smallest or the one with largest label). The currently-processed element is added to the newly-merged linked-list and all corresponding node flags are updated with the newly-merged linked-list's label. Each linked-list represents one of the numerically-simulated RB.

Figure 6A:
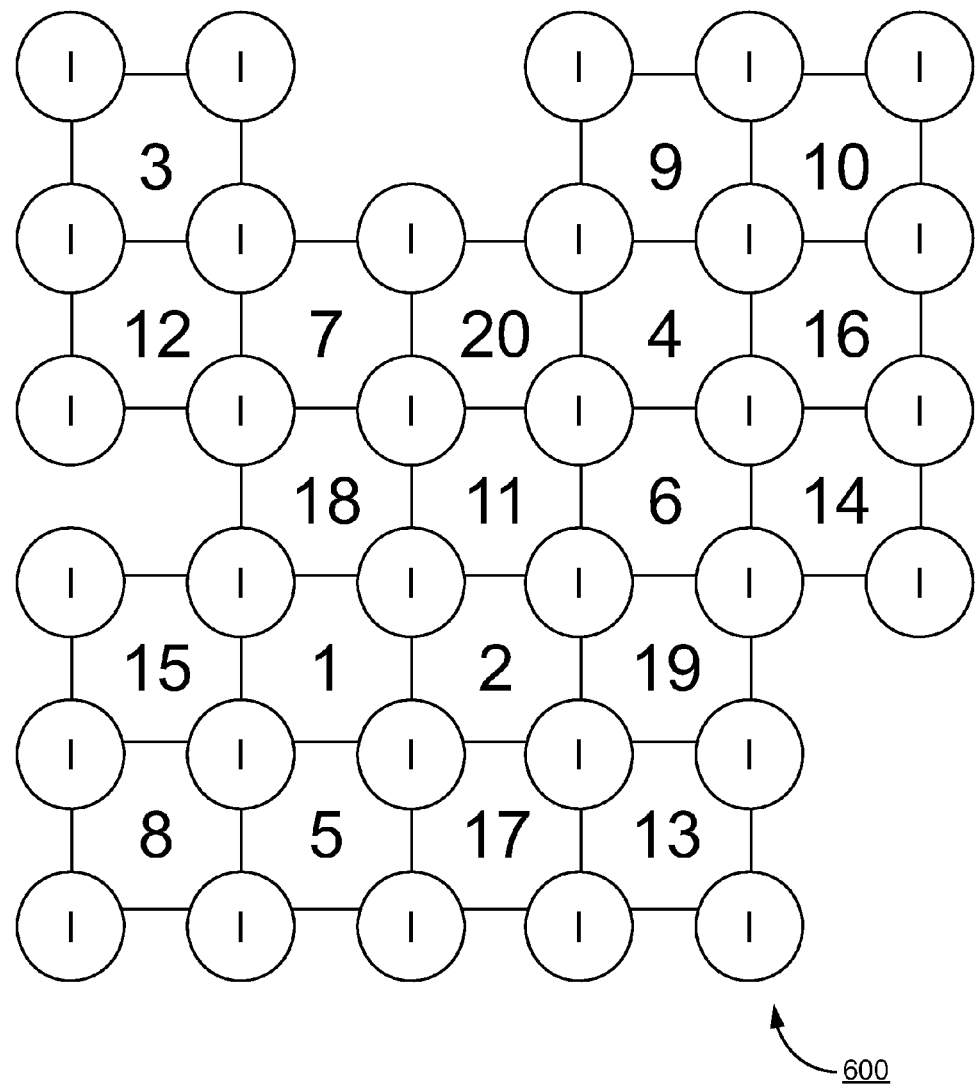
FIGS. 6A-6I are a series of diagrams showing an exemplary procedure or scheme of creating one or more linked-lists representing numerically-simulated RBs in accordance with one embodiment of the present invention.
Figure 6B:
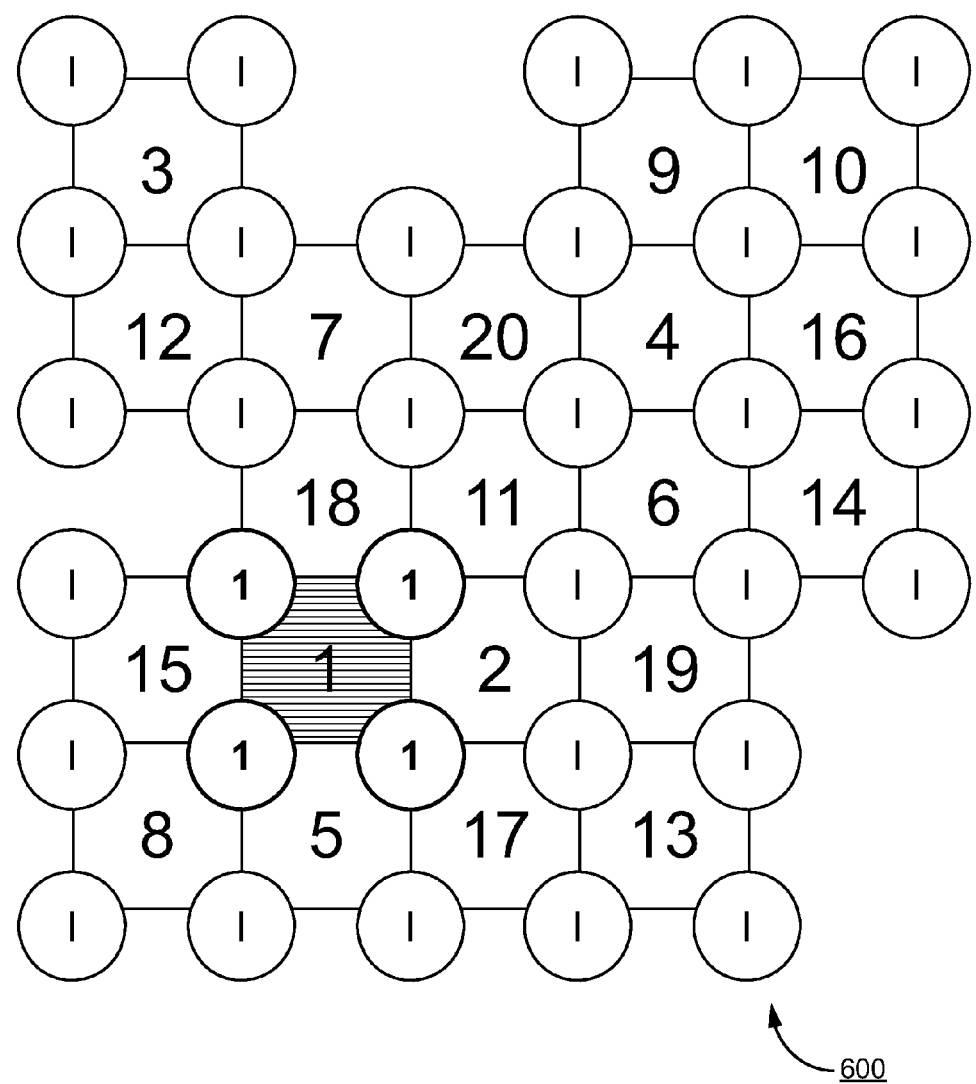
Figure 6C:
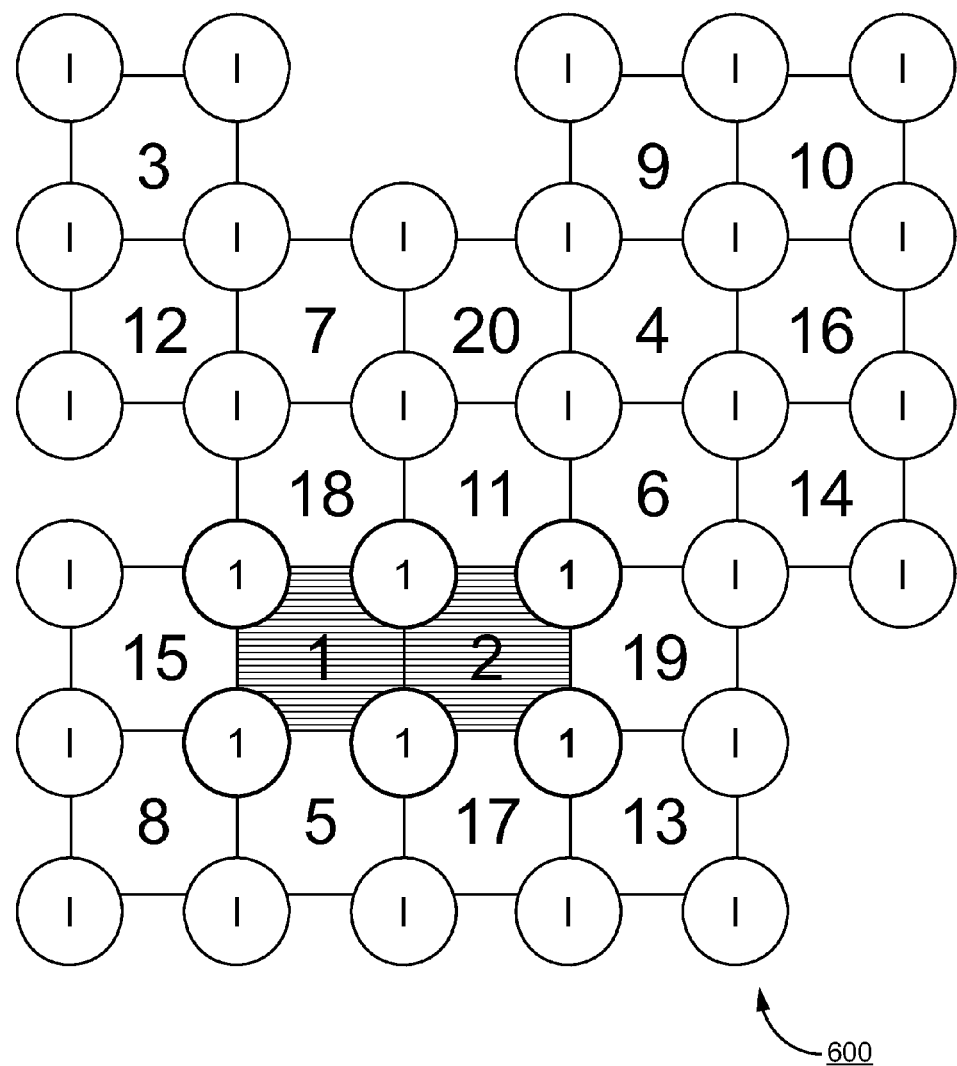

An example collectively-shown in FIGS. 6A-6I and FIG. 7 demonstrates an exemplary numerically-simulated RB creation procedure or scheme in accordance with one embodiment of the present invention. For illustration simplicity, a two-dimensional grid 600 is used. Exemplary rigid elements are numbered from 1 to 20 in an arbitrarily-assigned order (representing arbitrary nature of a general FEA model in the real world application). Each rigid element contains four corner nodes all initialized with an initialized value that is invalid for identifying numerically-simulated RB (denoted as "I"). An initialized condition is shown in FIG. 6A.

The numerically-simulated RB creation scheme loops over all rigid elements with the ascending order in terms of element numbers in this example. The loop starts with the first rigid element (i.e., rigid element "1") as the currently-processed element. Corresponding node flags of rigid element "1" contain initialized value. Based on the rule set forth in step 506*a*, a new linked-list 701 is created containing rigid element "1" and identified as "linked-list 1", and all node flags are set to "1" shown in FIG. 6B. Next, rigid element "2" becomes the currently-processed element, and its node flags contain either initialized value ("I") and the label of one particular existed linked-list ("linked-list 1"). Based on the rule set forth in step 506*b*, rigid element "2" is added to "linked-list 1" 702. All node flags are set to "1" (i.e., the identifier of "linked-list 1") shown in FIG. 6C.

Figure 6D:
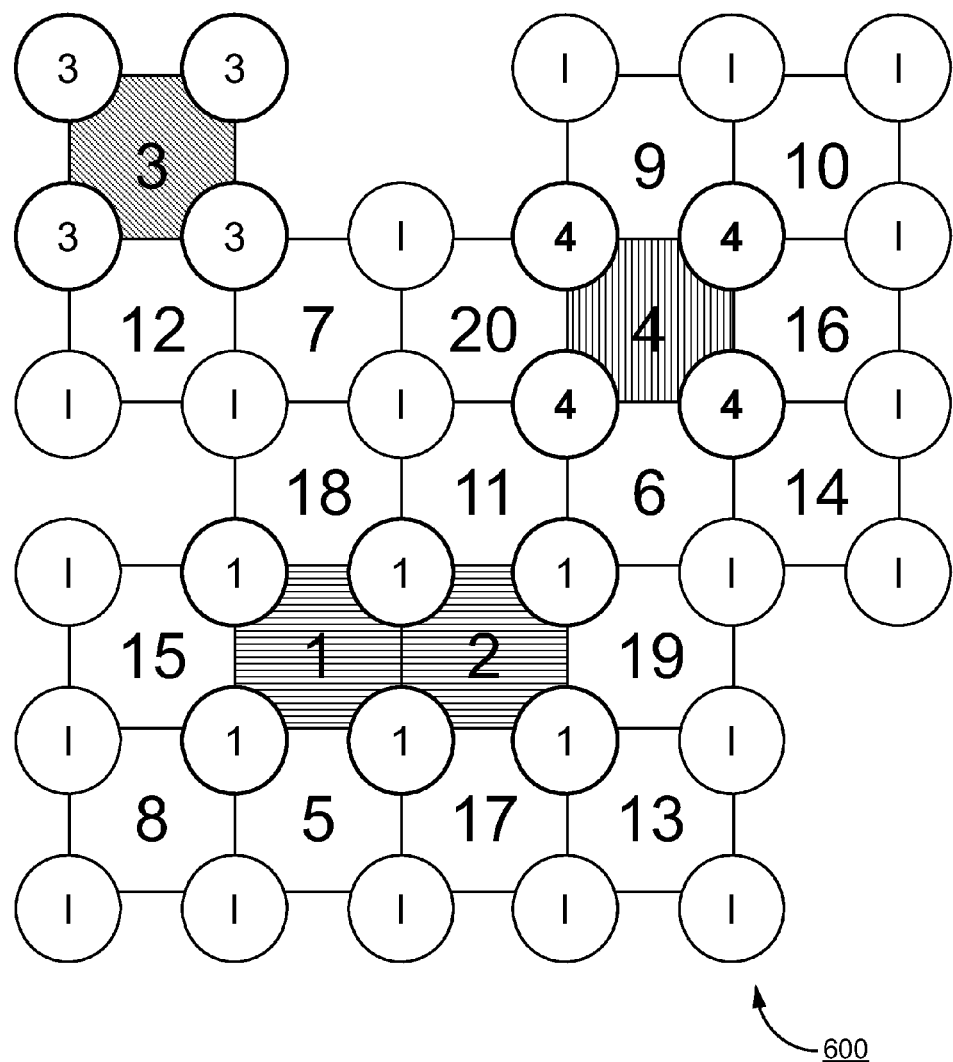
Figure 6E:
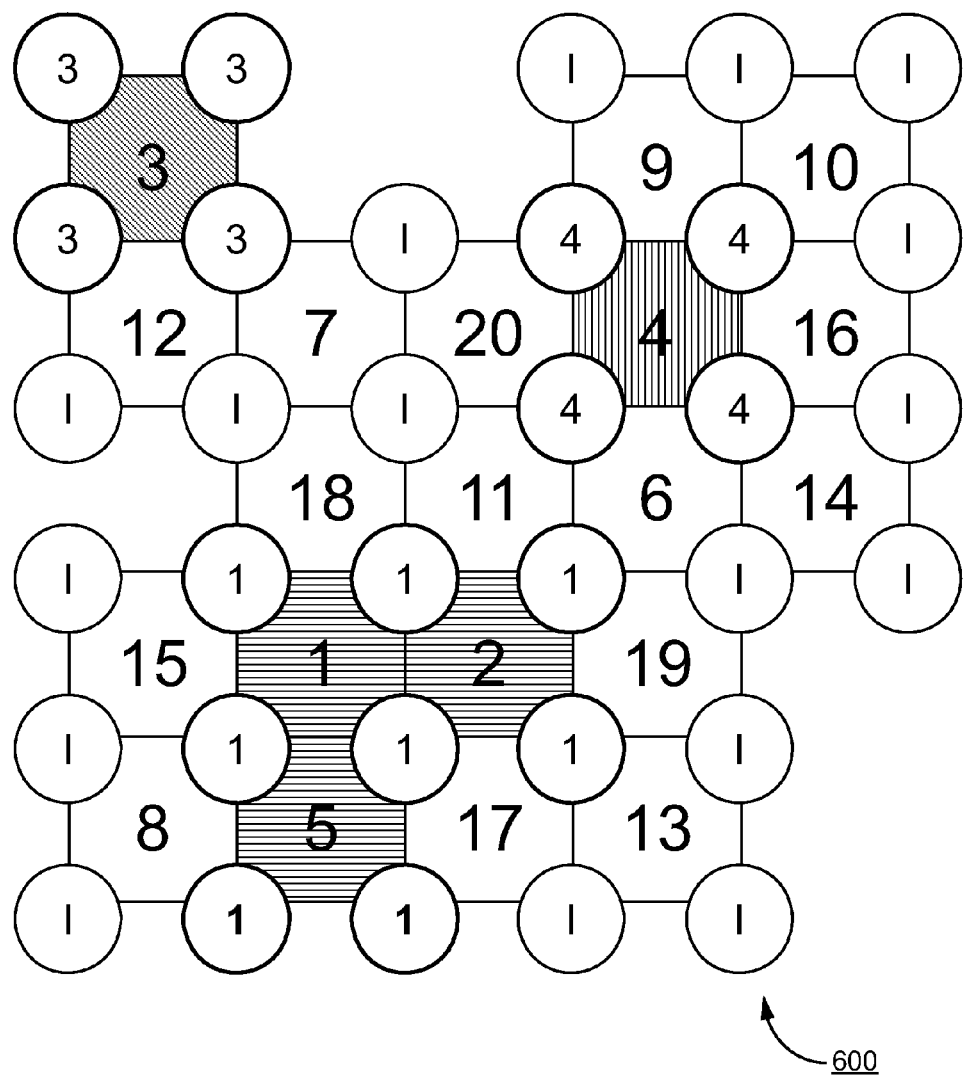

FIG. 6D shows two more rigid elements (i.e., rigid element "3" and "4") have been processed. New "linked-list 3" 703 and "linked-list 4" 704 are created according to the rule in step 506*a*. All nodes flags are updated with "3" or "4", respectively. For rigid element "5" shown in FIG. 6E, its node flags contain either initialized value "I" or a particular existed linked-list ("linked-list 1"). Rigid element "5" is added to "linked-list 1" 705 as a result.

Figure 6F:
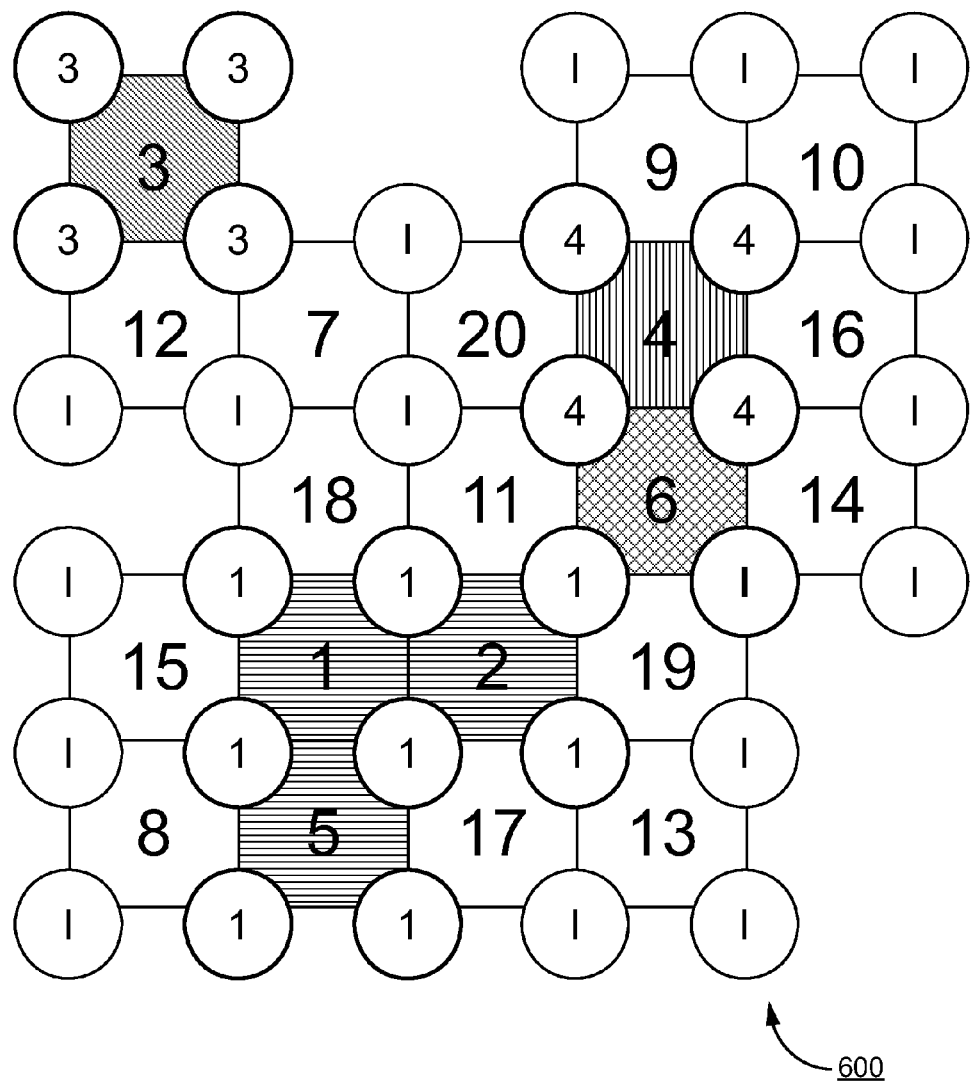
Figure 6G:
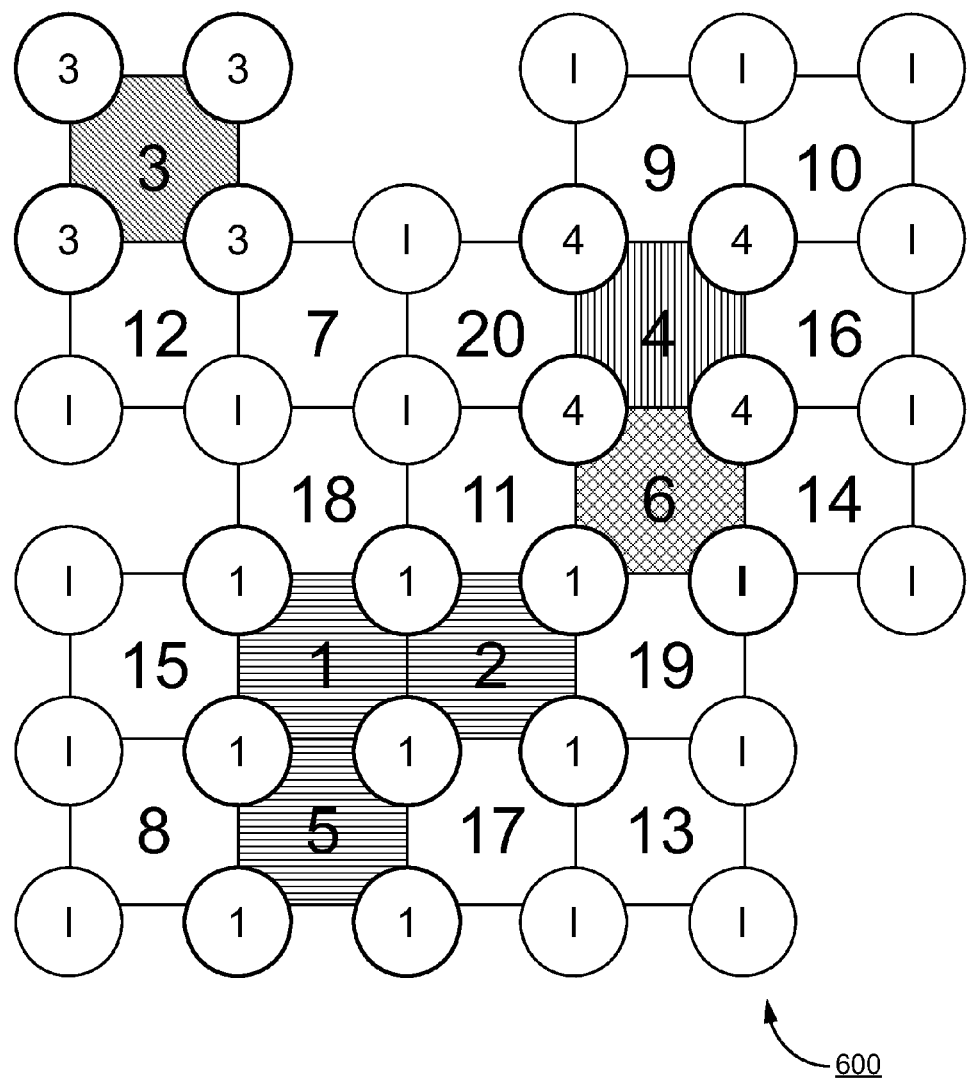
Figure 6H:
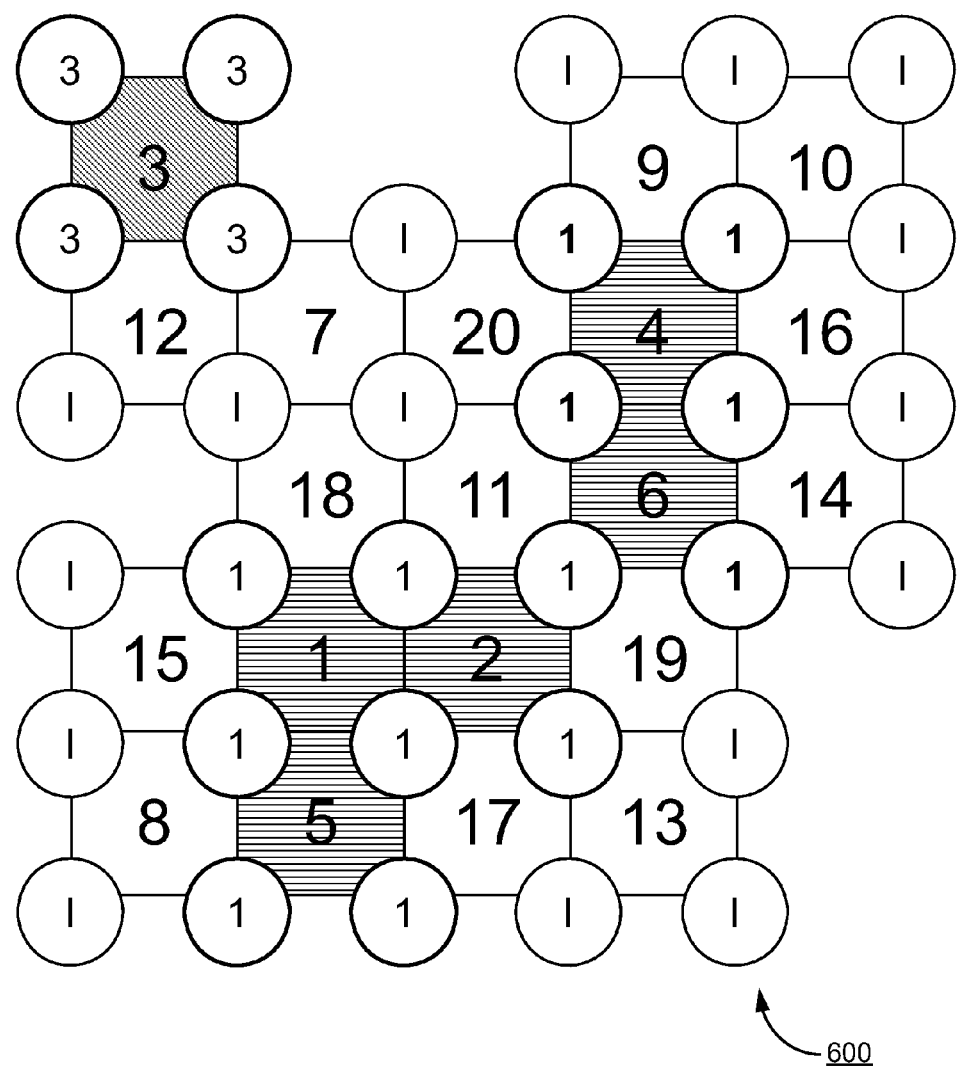

Corresponding node flags of the next rigid element "6", shown in FIG. 6F, contain initialized value in one flag, "linked-list 1" and "linked-list 4". Based on the rule set forth in step 506*c*, "linked-list 4" and "linked list 1" are merged into one list. In this example, they are merged into "linked-list 1" 706 having elements 1, 2, 5, 6 and 4. All node flags are set to "1" (identifier of "linked-list 1") shown in FIG. 6H.

Figure 6I:
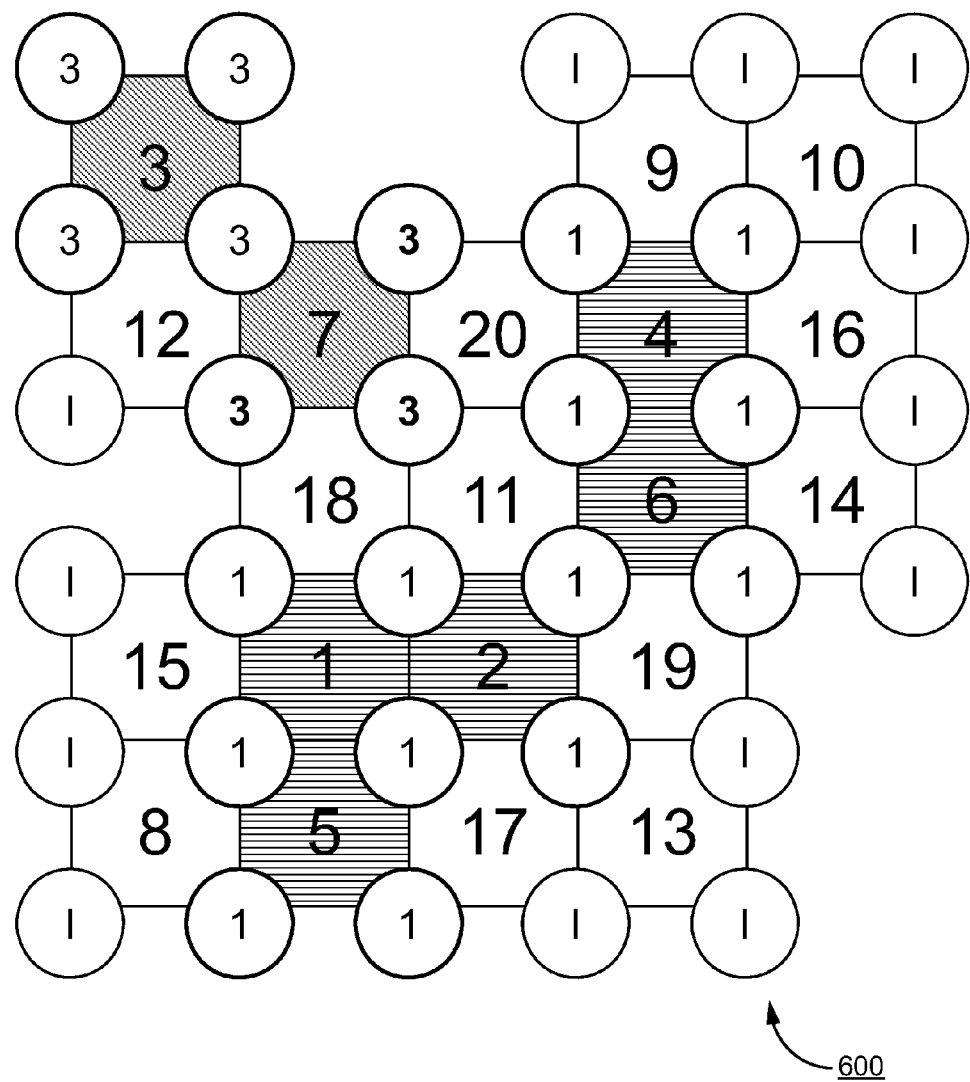
Figure 7:
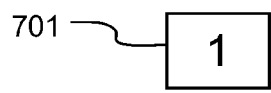
FIG. 7 is a diagram showing linked-lists correspond to the example of FIGS. 6A-6I.
Figure 7:
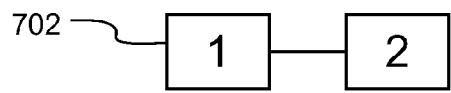
Figure 7:
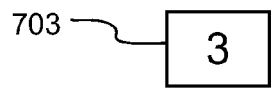
Figure 7:
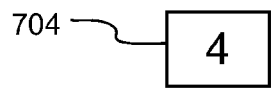
Figure 7:
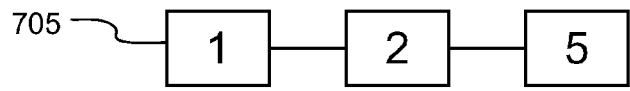
Figure 7:
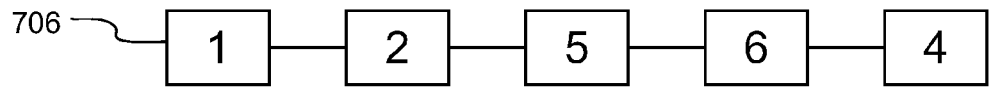
Figure 7:

FIG. 6I shows the next currently-processed rigid element "7" shares one node with rigid element "3", which is in "linked-list 3". Therefore, based on the rule in step 506*b*, rigid element "7" is added to "linked-list 3" 707 shown in FIG. 7. The scheme continues until all rigid elements in the FEA model have been processed. One or more distinct linked-lists are created at the end of the creation loop.

Finally at step 510, process 500 calculates physical properties of each numerically-simulated rigid body based on rigid elements in each corresponding linked-list (e.g., total mass, initial momentum and energy of the rigid body). Then the finite element analysis can be performed for these numerically-simulated rigid bodies properly. Process 500 ends thereafter.

Figure 4:
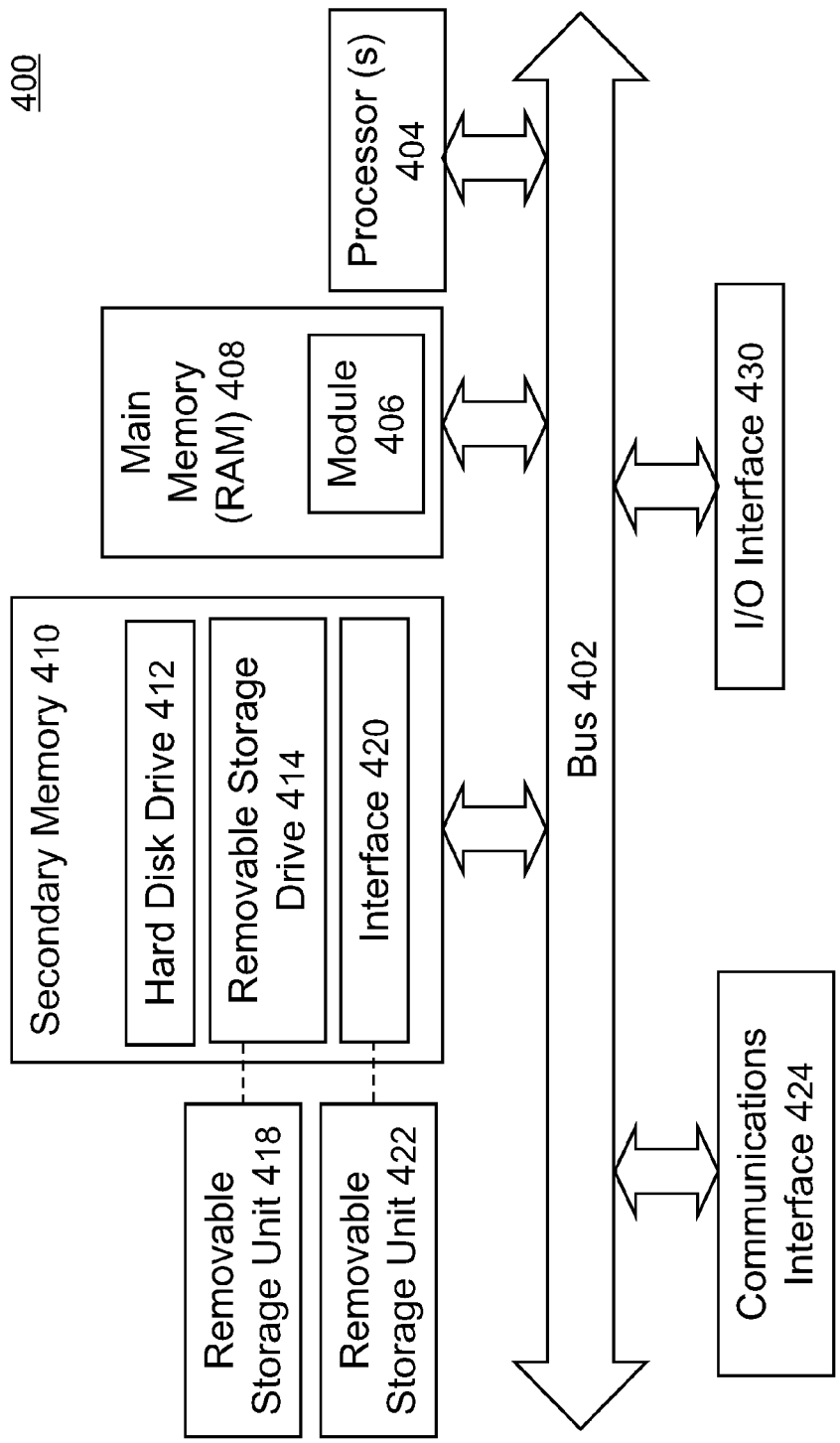
FIG. 4 is a function diagram showing salient components of a computer system, in which an embodiment of the present invention may be implemented.

According to one aspect, the present invention is directed towards one or more computer systems capable of carrying out the functionality described herein. An example of a computer system 400 is shown in FIG. 4. The computer system 400 includes one or more processors, such as processor 404. The processor 404 is connected to a computer system internal communication bus 402. Various software embodiments are described in terms of this exemplary computer system. After reading this description, it will become apparent to a person skilled in the relevant art(s) how to implement the invention using other computer systems and/or computer architectures.

Computer system 400 also includes a main memory 408, preferably random access memory (RAM), and may also include a secondary memory 410. The secondary memory 410 may include, for example, one or more hard disk drives 412 and/or one or more removable storage drives 414, representing a floppy disk drive, a magnetic tape drive, an optical disk drive, etc. The removable storage drive 414 reads from and/or writes to a removable storage unit 418 in a well-known manner. Removable storage unit 418, represents a floppy disk, magnetic tape, optical disk, etc. which is read by and written to by removable storage drive 414. As will be appreciated, the removable storage unit 418 includes a computer readable medium having stored therein computer software and/or data.

In alternative embodiments, secondary memory 410 may include other similar means for allowing computer programs or other instructions to be loaded into computer system 400. Such means may include, for example, a removable storage unit 422 and an interface 420. Examples of such may include a program cartridge and cartridge interface (such as that found in video game devices), a removable memory chip (such as an Erasable Programmable Read-Only Memory (EPROM), Universal Serial Bus (USB) flash memory, or PROM) and associated socket, and other removable storage units 422 and interfaces 420 which allow software and data to be transferred from the removable storage unit 422 to computer system 400. In general, Computer system 400 is controlled and coordinated by operating system (OS) software, which performs tasks such as process scheduling, memory management, networking and I/O services.

There may also be a communications interface 424 connecting to the bus 402. Communications interface 424 allows software and data to be transferred between computer system 400 and external devices. Examples of communications interface 424 may include a modem, a network interface (such as an Ethernet card), a communications port, a Personal Computer Memory Card International Association (PCMCIA) slot and card, etc.

The computer 400 communicates with other computing devices over a data network based on a special set of rules (i.e., a protocol). One of the common protocols is TCP/IP (Transmission Control Protocol/Internet Protocol) commonly used in the Internet. In general, the communication interface 424 manages the assembling of a data file into smaller packets that are transmitted over the data network or reassembles received packets into the original data file. In addition, the communication interface 424 handles the address part of each packet so that it gets to the right destination or intercepts packets destined for the computer 400.

In this document, the terms "computer recordable storage medium", "computer recordable medium" and "computer readable medium" are used to generally refer to media such as removable storage drive 414, and/or a hard disk installed in hard disk drive 412. These computer program products are means for providing software to computer system 400. The invention is directed to such computer program products.

The computer system 400 may also include an input/output (I/O) interface 430, which provides the computer system 400 to access monitor, keyboard, mouse, printer, scanner, plotter, and alike.

Computer programs (also called computer control logic) are stored as application modules 406 in main memory 408 and/or secondary memory 410. Computer programs may also be received via communications interface 424. Such computer programs, when executed, enable the computer system 400 to perform the features of the present invention as discussed herein. In particular, the computer programs, when executed, enable the processor 404 to perform features of the present invention. Accordingly, such computer programs represent controllers of the computer system 400.

In an embodiment where the invention is implemented using software, the software may be stored in a computer program product and loaded into computer system 400 using removable storage drive 414, hard drive 412, or communications interface 424. The application module 406, when executed by the processor 404, causes the processor 404 to perform the functions of the invention as described herein.

The main memory 408 may be loaded with one or more application modules 406 (e.g., a finite element analysis application module) that can be executed by one or more processors 404 with or without a user input through the I/O interface 430 to achieve desired tasks (e.g., creating numerically-simulated rigid bodies). In operation, when at least one processor 404 executes one of the application modules 406, the results are computed and stored in the secondary memory 410 (i.e., hard disk drive 412). The status of the time-marching engineering simulation (e.g., deformed beam element, deformed surface, and their relative position, etc.) is reported to the user via the I/O interface 430 either in a text or in a graphical form.

Finally, to ensure computation efficiency in simulating RBs in a massively parallel computer, a special technique is used during initial computing load balancing phase (e.g., domain decomposition). Traditionally domain decomposition is element based technique. Each element is assigned a weight (computational cost), and the decomposition attempts to assign elements to processors in such a way as to balance these weights on each processor—so each processor gets the same total weight. For RBs, it is modified as follows: for each RB, the total weight of the elements in that RB is computed. The total weight is then assigned to particular one of the elements in the RB, and the weights of the rest are reset to 0. Decomposition is then performed as usual, and each element is assigned to a processor. And for each RB, all the elements are reassigned to whichever processor ended up owning the particular one element that had non-zero weight. This maintains the total weight distribution during the decomposition, while ensuring that all the elements of a RB end up on the same processor.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas linked-list has been described to represent numerically-simulated RB, other equivalent data structure can be used instead, for example, a simple list. Additionally, whereas three-dimensional finite elements have been shown and described to be rigid elements, one- or two-dimensional finite elements can also be used for forming numerically-simulated RBs, (e.g., beams, trusses, plates, etc.). Furthermore, whereas hexahedral elements have been shown and described to form rigid bodies, other types of solid elements can be used, for example, tetrahedral, pentahedral elements. Moreover, whereas only few exemplary rigid bodies have been described and shown, majority use of the present invention includes a large number (e.g., millions) of rigid bodies. Finally, the example shown in FIGS. 6A-6I is in two-dimension for illustration simplicity, the present invention applies to three-dimensional finite element model and rigid elements thereof. In summary, the scope of the invention should not be restricted to the specific exemplary embodiments disclosed herein, and all modifications that are readily suggested to those of ordinary skill in the art should be included within the spirit and purview of this application and scope of the appended claims.

We claim:

1. A method of creating numerically-simulated rigid bodies in finite element analysis (FEA) of a computer aided engineering system, said method comprising:

defining, in a computer system having a FEA application module installed thereon, a FEA model having a plurality of nodal points and at least one rigid finite element, each of the at least one rigid finite element having a set of user defined information representing one or more physical quantities;

creating an array of node flags each flag being associated with a corresponding one of the plurality of nodal points;

initializing the array node flags with a initialized value that is invalid for identifying numerically-simulated rigid bodies;

looping through said all of the at least one rigid finite element once, wherein at each currently-processed element in said looping, examining corresponding node flags of the currently-processed element's nodes;

when said corresponding node flags contain only the initialized value, creating a new linked-list representing one of one or more numerically-simulated rigid bodies and labeled said new linked-list with the currently-processed element's ID and updating the corresponding node flags with the ID;

when said corresponding node flags contain either the initialized value or a particular linked-list's ID, adding the currently-processed element to the particular linked-list and updating the corresponding node flags with the particular linked-list's ID;

when said corresponding node flags contain more than one linked-lists' ID, merging all of the more than one linked-lists into one of the said more than one linked-lists as a newly-merged linked-list, updating the corresponding node flags with the newly-merged linked-list's ID; and calculating a set of physical properties of said each numerically-simulated rigid body in accordance with the set of user defined information corresponding each rigid finite element in said corresponding linked-list such that said each numerically-simulated rigid body is set up to be processed in the finite element analysis for assisting user to make decision in improvement of engineering product design.

2. The method of claim 1, wherein said one or more physical quantities comprise a mass density.

3. The method of claim 1, wherein said each numerically-simulated rigid body contains more than one of said at least one rigid finite element.

4. The method of claim 3, wherein said each numerically-simulated rigid body includes a first rigid finite element and a second rigid finite element sharing a first node, while the first rigid finite element and a third rigid finite element share a second node.

5. The method of claim 1, wherein the initialized value is an invalid number, while each the linked-list's ID is a numerical number.

6. The method of claim 1, wherein the initialized value is a number larger than largest of the linked-list's ID.

7. The method of claim 1, wherein the initialized value is a number smaller than smallest of the linked-list's ID.

8. A system for creating numerically-simulated rigid bodies in a finite element analysis comprising:

a main memory for storing computer readable code for a finite element analysis application module;

at least one processor coupled to the main memory, said at least one processor executing the computer readable code in the main memory to cause the application module to perform operations by a method of:

defining a FEA model having a plurality of nodal points and at least one rigid finite element, each of the at least one rigid finite element having a set of user defined information representing one or more physical quantities;

creating an array of node flags each flag being associated with a corresponding one of the plurality of nodal points;

initializing the array node flags with a initialized value that is invalid for identifying numerically-simulated rigid bodies;

looping through said all of the at least one rigid finite element once, wherein at each currently-processed element in said looping, examining corresponding node flags of the currently-processed element's nodes;

when said corresponding node flags contain only the initialized value, creating a new linked-list representing one of one or more numerically-simulated rigid bodies and labeled said new linked-list with the currently-processed element's ID and updating the corresponding node flags with the ID;

when said corresponding node flags contain either the initialized value or a particular linked-list's ID, adding the currently-processed element to the particular linked-list and updating the corresponding node flags with the particular linked-list's ID;

when said corresponding node flags contain more than one linked-lists' ID, merging all of the more than one linked-lists into one of the said more than one linked-lists as a newly-merged linked-list, updating the corresponding node flags with the newly-merged linked-list's ID; and calculating a set of physical properties of said each numerically-simulated rigid body in accordance with the set of user defined information corresponding each rigid finite element in said corresponding linked-list such that said each numerically-simulated rigid body is set up to be processed in the finite element analysis for assisting user to make decision in improvement of engineering product design.

9. The system of claim 8, wherein said each numerically-simulated rigid body contains more than one of said at least one rigid finite element.

10. The system of claim 9, wherein said each numerically-simulated rigid body includes a first rigid finite element and a second rigid finite element sharing a first node, while the first rigid finite element and a third rigid finite element share a second node.

11. A non-transitory computer readable storage medium containing instructions for controlling a computer system for creating numerically-simulated rigid bodies in a finite element analysis by a method comprising:

defining, in a computer system having a FEA application module installed thereon, a FEA model having a plurality of nodal points and at least one rigid finite element, each of the at least one rigid finite element having a set of user defined information representing one or more physical quantities;

creating an array of node flags each flag being associated with a corresponding one of the plurality of nodal points;

initializing the array node flags with a initialized value that is invalid for identifying numerically-simulated rigid bodies;

looping through said all of the at least one rigid finite element once, wherein at each currently-processed element in said looping, examining corresponding node flags of the currently-processed element's nodes;

when said corresponding node flags contain only the initialized value, creating a new linked-list representing one of one or more numerically-simulated rigid bodies and labeled said new linked-list with the currently-processed element's ID and updating the corresponding node flags with the ID;

when said corresponding node flags contain either the initialized value or a particular linked-list's ID, adding the currently-processed element to the particular linked-list and updating the corresponding node flags with the particular linked-list's ID;

when said corresponding node flags contain more than one linked-lists' ID, merging all of the more than one linked-lists into one of the said more than one linked-lists as a newly-merged linked-list, updating the corresponding node flags with the newly-merged linked-list's ID; and calculating a set of physical properties of said each numerically-simulated rigid body in accordance with the set of user defined information corresponding each rigid finite element in said corresponding linked-list such that said each numerically-simulated rigid body is set up to be processed in the finite element analysis for assisting user to make decision in improvement of engineering product design.

12. The non-transitory computer readable storage medium of claim 11, wherein said each numerically-simulated rigid body contains more than one of said at least one rigid finite element.

13. The non-transitory computer readable storage medium of claim 12, wherein said each numerically-simulated rigid body includes a first rigid finite element and a second rigid finite element sharing a first node, while the first rigid finite element and a third rigid finite element share a second node.

* * * * *